United States Patent
Watson et al.

(10) Patent No.: US 7,297,453 B2
(45) Date of Patent: Nov. 20, 2007

(54) SYSTEMS AND METHODS FOR MITIGATING VARIANCES ON A PATTERNED WAFER USING A PREDICTION MODEL

(75) Inventors: Sterling G. Watson, Palo Alto, CA (US); Ady Levy, Sunnyvale, CA (US); Chris A. Mack, Austin, TX (US); Stanley E. Stokowski, Danville, CA (US); Zain K. Saidin, San Mateo, CA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 0 days.

(21) Appl. No.: 11/394,900

(22) Filed: Mar. 31, 2006

(65) Prior Publication Data

US 2006/0240336 A1 Oct. 26, 2006

Related U.S. Application Data

(60) Provisional application No. 60/671,292, filed on Apr. 13, 2005.

(51) Int. Cl.
*G03C 5/00* (2006.01)
*G03F 9/00* (2006.01)

(52) U.S. Cl. ............... 430/30; 430/5; 430/945; 382/144; 382/145; 716/19

(58) Field of Classification Search ............... 430/5, 430/30, 945; 382/144, 145; 716/19
See application file for complete search history.

(56) References Cited

U.S. PATENT DOCUMENTS

| 6,516,085 | B1 | 2/2003 | Wiley et al. |
| 6,654,489 | B2 | 11/2003 | Wiley et al. |
| 7,123,356 | B1 | 10/2006 | Stokowski et al. |
| 2004/0009416 | A1 | 1/2004 | Peterson et al. |
| 2004/0091142 | A1 | 5/2004 | Peterson et al. |
| 2005/0084767 | A1* | 4/2005 | Zait et al. ............ 430/5 |
| 2006/0183025 | A1* | 8/2006 | Yang et al. ............ 430/5 |
| 2006/0236294 | A1 | 10/2006 | Saidin et al. |

FOREIGN PATENT DOCUMENTS

WO PCT/IL2004/000653 1/2005

* cited by examiner

*Primary Examiner*—Christopher G. Young
(74) *Attorney, Agent, or Firm*—Beyer Weaver LLP

(57) ABSTRACT

Disclosed are systems and methods for mitigating variances (e.g., critical dimension variances) on a patterned wafer are provided. In general, variances of a patterned wafer are predicted using one or more reticle fabrication and/or wafer processing models. The predicted variances are used to modify selected transparent portions of the reticle that is to be used to produce the patterned wafer. In a specific implementation, an optical beam, such as a femto-second laser, is applied to the reticle at a plurality of embedded positions, and the optical beam is configured to form specific volumes of altered optical properties within the transparent material of the reticle at the specified positions. These reticle volumes that are created at specific positions of the reticle result in varying amounts of light transmission or dose through the reticle at such specific positions so as to mitigate the identified variances on a wafer that is patterned using the modified reticle.

15 Claims, 7 Drawing Sheets

SYSTEMS AND METHODS FOR MITIGATING VARIANCES ON A PATTERNED WAFER USING A PREDICTION MODEL

RELATED APPLICATION DATA

The present application claims priority under 35 U.S.C. 119(e) to U.S. Provisional Patent Application No. 60/671,292 for SYSTEMS AND METHODS FOR MITIGATING VARIANCES ON A PATTERNED WAFER USING A PREDICTION MODEL filed on Apr. 13, 2005, the entire disclosure of which is incorporated herein by reference for all purposes.

FIELD OF THE INVENTION

The invention pertains in general to integrated circuit design and fabrication, and in particular to mitigating actual or potential variations on a patterned wafer.

BACKGROUND

Fabricating semiconductor devices such as logic and memory devices typically includes processing a substrate such as a semiconductor wafer using a number of semiconductor fabrication processes to form various features and multiple levels of the semiconductor devices. For example lithography is a semiconductor fabrication process that involves transferring a pattern from a reticle to a resist arranged on a semiconductor wafer. Additional examples of semiconductor fabrication processes include, but are not limited to, chemical-mechanical polishing, etch, deposition, and ion implantation. Multiple semiconductor devices may be fabricated in an arrangement on a semiconductor wafer and then separated into individual semiconductor devices.

Lithography is typically one of the most important processes in integrated circuit manufacturing since this is the process in which features are patterned on the wafer. The pattern printed in a resist by lithography is then utilized as a masking layer to transfer the pattern to additional layers on the wafer in subsequent processing steps. Therefore, the pattern that is formed on the wafer during lithography directly affects the features of the integrated circuits that are formed on the wafer. Consequently, defects that are formed on the wafer during lithography may be particularly problematic for the integrated circuit manufacturing process. One of the many ways in which defects may be formed on the patterned wafer during lithography is by transfer of defects that are present on the reticle to the wafer. Therefore, detection and correction of defects on the reticle such as unwanted particulate or other matter are performed rather stringently to prevent as many defects on the reticle from being transferred to the wafer during lithography.

However, as the dimensions of integrated circuits decrease and the patterns being transferred from the reticle to the wafer become more complex, defects or marginalities in the features formed on the reticle become increasingly important. In particular, if the pattern is not formed on the reticle, such discrepancies increasingly produce defects on the wafer as the dimension of the pattern decrease and the complexity of the pattern increases. In addition, marginalities in the reticle design may cause the design to print incorrectly on the wafer. Therefore, significant efforts have been devoted to methods and systems that can be used to detect problems in the pattern on the reticle or in the design that will cause problems on the wafer. These efforts are relatively complex and difficult due, at least in part, to the fact that not all discrepancies or marginalities in the pattern formed on the reticle (as compared to the ideal pattern) will cause errors on the wafer that will adversely affect the integrated circuit. In other words, some error in the pattern formed on the reticle may not produce defects on the wafer at all or may produce defects on the wafer that will not reduce the performance characteristics of the integrated circuit.

Accordingly, improved mechanisms for correcting problems or variations on the patterned wafer are needed.

SUMMARY OF THE INVENTION

Systems and methods for mitigating variances (e.g., critical dimension (CD) variances) on a patterned wafer are provided. In general, variances of a patterned wafer are predicted using one or more reticle fabrication and/or wafer processing models. The predicted variances are used to modify selected transparent portions of the reticle that is to be used to produce the patterned wafer. In a specific implementation, an optical beam, such as a femto-second laser, is applied to the reticle at a plurality of embedded positions, and the optical beam is configured to form specific volumes of altered optical properties within the transparent material of the reticle at the specified positions. These reticle volumes that are created at specific positions of the reticle result in varying amounts of light transmission or dose through the reticle at such specific positions so as to mitigate the predicted variances on a wafer that is patterned using the modified reticle.

In one aspect, the present invention provides a method that includes predicting weaknesses in a design and then mitigating such predicted weaknesses in a wafer that is patterned with such design. One or more models are applied to a given design, and the model(s) simulate an image of a reticle or wafer that would be produced with the given design using a set of processes (e.g., reticle writing, lithography, and/or wafer fabrication processes). The simulation includes a plurality of different process parameters, such as a plurality of dose and focus combinations. The simulation can predict regions with weaknesses. Using these regions, the reticle can be modified to minimize the occurrence of the predicted weaknesses in the patterned wafer.

In another aspect, the present invention provides a method that includes using one or more models in conjunction with inspection results to modify the reticle to minimize variations on the wafer. The model can include algorithms for simulating the lithographic process under various conditions, such as different dose and focus combinations. In one implementation, a map of variations found on the wafer is transformed through the inverse of the reticle to wafer process to generate a dose map to be used to modify the reticle's transmission characteristics at specified locations.

These and other features and advantages of the present invention will be presented in more detail in the following specification of the invention and the accompanying figures which illustrate by way of example the principles of the invention.

DETAILED DESCRIPTION OF SPECIFIC EMBODIMENTS

Figure 1:
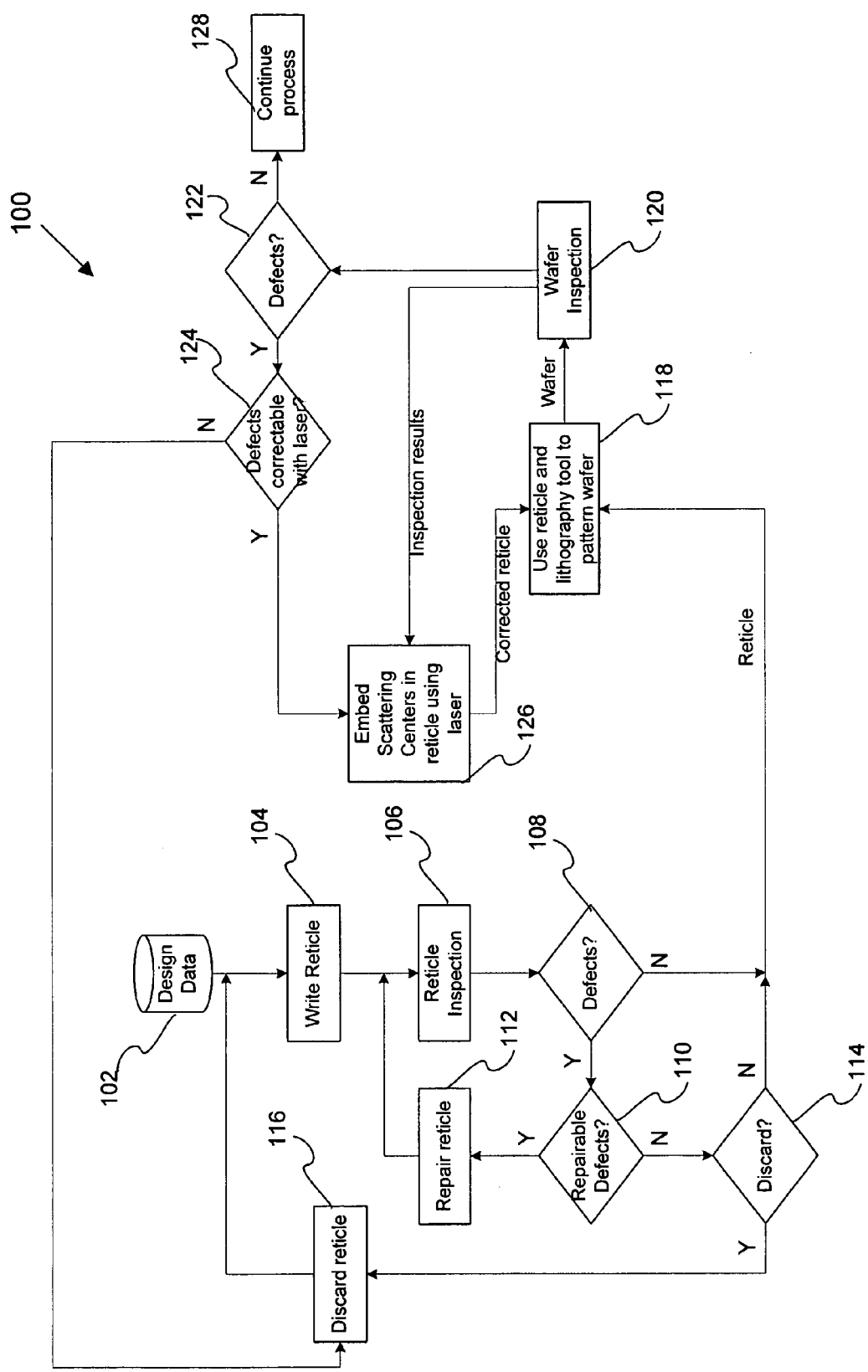
FIG. 1 is a flowchart illustrating an integrated circuit (IC) device design process in which a laser may be utilized to change the optical properties of a reticle in accordance with various embodiments of the present invention.

Reference will now be made in detail to a specific embodiment of the invention. An example of this embodiment is illustrated in the accompanying drawings. While the invention will be described in conjunction with this specific embodiment, it will be understood that it is not intended to limit the invention to one embodiment. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

A "reticle" or a "mask" is generally defined as a substantially transparent substrate having substantially opaque regions formed thereon and configured in a pattern. The substrate may include, for example, a glass material such as quartz. The substantially opaque regions may be formed of a material such as chromium. A reticle may be disposed above a resist-covered wafer during an exposure step of a lithography process such that the pattern on the reticle may be transferred to the resist. For example, substantially opaque regions of the reticle may protect underlying regions of the resist from exposure to an energy source. Many different types of reticles are known in the art, and the term reticle as used herein is intended to encompass all types of reticles.

The present invention generally includes techniques for using an optical beam, such as a laser, on a reticle to correct or change one or more optical properties, such as a transmission level, at one or more specific locations in the reticle. One such reticle correction apparatus is further described in International Application having Application No. PCT/IL2004/000653, filed Jul. 18, 2004, and in U.S. Provisional Application No. 60/488,717, filed Jul. 18, 2003, which applications are incorporated by reference in their entirety.

In one example, CD variation is corrected by using a laser to form "scattering centers" (SC's) that are embedded within the reticle to obtain varying amounts of light transmission or dose through the reticle. The SC's are specific volumes of damage that are created with the laser at various positions embedded within the reticle to thereby alter the transmission levels through the reticle at particular locations of the reticle. An increase in the number of SC's created in a given location results in a reduction in dose through such location in the reticle, as compared with another location with fewer SC's. These SC's may be formed in the interior transparent portion of the reticle, as opposed to the pattern portion of the reticle. Thus, one location of the reticle can have a different dose than another location on the reticle as a result of specific SC placement by the laser. In this application of the laser, the resulting dose variation of the reticle is selected to cause a more uniform distribution of CD across the resulting wafer.

The following description is mainly directed towards minimizing CD variation on a wafer by modifying a reticle using an optical beam, such as a femto-second laser. However, it should be understood that the reticle may also be modified with an optical beam so as to change any wafer parameter, besides CD, and such modification can occur during any stage of the fabrication process.

INTRODUCTION

FIG. 1 is a flowchart illustrating an integrated circuit (IC) device design process 100 in which a laser may be utilized to change the optical properties of a reticle in accordance with various embodiments of the present invention. To provide a simplified introduction to basic concepts of the present invention, the following process 100 will initially be described in the context of using a laser only to correct CD variation that is indicated by a wafer inspection. Later described embodiments include various alternative applications of such laser to correct or change numerous types of optical properties, including dose variation, at various stages of the design process. This initial introduction is merely illustrative and is not meant to limit the scope of the invention.

Initially, design data is received at operation 102. Design data may include any portion of an IC design for implementation in the IC device. The IC design can be developed using any number of suitable design techniques. For example, a designer may create the IC design by using preexisting schematic library blocks from various electronic design automation (EDA) tools. In some cases, the designer may create the IC design or part of the IC design from scratch with the aid of any suitable design system, such as conventional computer aided design (CAD) tools. For example, the designer may use a schematic CAD tool to plan the logic diagrams for a particular IC design. Still further, the designer may write a description of the IC design or portions of the IC design with the aid of a hardware design language, such as VHDL.

The IC design is generally converted into design data that is in a suitable format that allows a pattern corresponding to the IC design to be produced onto a reticle. For instance, design data may be in a GDSII format. Design data may also be in a format of a database, such as a circuit layout pattern database that is generated from the IC design using any suitable tool, for example, by using EDA or CAD tools. The circuit layout pattern database is composed of a plurality of electronic representations of layout patterns for IC layers that are converted into a plurality of reticles that are used to fabricate a plurality of physical layers of an IC device. Each physical layer of the fabricated IC device corresponds to one of the reticles and an associated one of the electronic representations of the circuit pattern database. For example, one electronic representation may correspond to a diffusion pattern on a silicon substrate, another to a gate oxide pattern, another to a gate polysilicon pattern, another to a contact pattern on an interlayer dielectric, another to a line pattern on a metallization layer, and so on. Each electronic representation is composed of a plurality of polygons or other shapes, which together define the reticle pattern.

After the design data is received, the design data is used to write a reticle in operation 104. The reticle may be written using any suitable pattern generator or reticle writer equipment, such as a vector scan E-beam tool model EBM-4500, which is commercially available from Nuflare Technology Inc., Japan. The reticle corresponds to one or more electronic representation(s) from the design data. The reticle is then inspected in operation 106, and it is determined whether the reticle has any defects in operation 108. Any method or technique may be used for reticle inspection. One such reticle inspection technique is described in U.S. patent application Ser. No. 09/679,617, entitled "METHODS AND SYSTEMS FOR INSPECTING RETICLES USING AERIAL IMAGING AND DIE-TO-DATABASE DETECTION", filed Oct. 6, 2003 by Stan Stokowski et al, which application is herein incorporated by reference in its entirety for all purposes. Defects are defined herein as any discrepancy on the reticle or wafer, including missing material, extraneous material, variations in critical dimension (CD) across the reticle, etc. That is, a defect is generally any characteristic of the reticle or wafer that fails to meet an expected or ideal requirement.

If the reticle has no defects, the reticle is used along with one or more lithography tools (e.g., scanner, stepper, etc.) to pattern the wafer (e.g., the reticle is used to fabricate a physical layer of the IC device by transferring the reticle pattern onto a photoresist covering the wafer and then etch such pattern onto an underlying device layer of the wafer) in operation 118. However, if the reticle has a defect, a determination is made as to whether the defect is repairable in operation 110. A repairable defect may be defined according to any suitable guideline or specification. For instance, localized defects (e.g., extra pattern material on the reticle; missing pattern material on the reticle) in the reticle pattern can be deemed repairable. In some embodiments, the repairable defects are confined to a substantially limited area of the reticle pattern.

If the defect is repairable, the repairs are made in operation 112 and the repaired reticle is then inspected again in operation 106. If the defect is not repairable, it is then determined whether the reticle should be discarded in operation 114. In certain cases, even when the reticle defects are not eliminated (or repaired) in the reticle pattern itself, the reticle may still be usable as further described below. If the reticle is not usable, then the reticle is discarded in operation 116 and another and hopefully, non-defective reticle is written in operation 104. For instance, changes may be made to the design data or the reticle writing process may be adjusted in order to produce a non-defective reticle. If the determination in operation 114 is negative, then the reticle that was inspected can then be used along with any suitable type of lithography tool to pattern the wafer in operation 118.

After the wafer has been patterned with a lithography tool in operation 118, the wafer may then be inspected in operation 120. Any conventionally available wafer inspection technique or mechanism can be used for inspecting the wafer. Next, a determination as to whether the wafer includes any defects is performed in operation 122. If it is determined that no defects are present in the wafer, then the wafer is allowed to continue along the design process to fabricate the IC device(s) in operation 128. However, if it is determined that a defect is present in the wafer, it is then determined whether the defect is correctable with a laser in operation 124. For instance, a defect is correctable with a laser when it is determined that the wafer defect can be mitigated by a change to the effective light transmission through the reticle. Also, if it is determined that a defect is present, the wafer may be discarded.

If the defect is not correctable by use of a laser, operation 116 is repeated, where the reticle is discarded. However, if the defect is correctable, then the laser may be used to create scattering centers (SC's) in the reticle to change the light transmission properties through at specific locations on the reticle. The properties of the SC's (e.g., such as the density, size, and type) can be based on the inspection results (e.g., CD variation information) received from the wafer inspection 120. After creating the SC's in the reticle, the corrected reticle can now be used along with various lithography tools to pattern another wafer in operation 118.

It should be noted that the present invention can employ any suitable number and type of reticle and/or wafer inspection or defect review tools. For example, KLA 301, 351, or 353 UV Reticle Inspection Tools, AIT-XP, eS20XP, TeraStar, and SL3UV inspection tools, or eV300 and CRS3100 review tools, commercially available from KLA-Tencor of San Jose, Calif., may be employed. Each inspection tool may take the form of an optical system, such as a bright field or dark field optical system. The station may also utilize both bright field and dark field modes. Examples of bright field systems include the 2350, 2351, 2360, and 2370 from KLA-Tencor, Corp. of San Jose, Calif. Examples of dark field system include the AIT II, AIT XP, Fusion, Fusion UV, and SP1 PatternPro available from KLA-Tencor, Corp. of San Jose, Calif. Each tool may also take the form of an electron beam (ebeam) system, such as a scanning, snapshot, or step-and-repeat type ebeam system. A station may be designed to detect special types of defects, such as macro defects across a large area of the sample, defects on a bare substrate, or defects within solder bumps (e.g., ball grid array bumps). Each inspection tool may be a stand alone device or integrated within a processing or lithography tool. Additionally, the laser correction tool (e.g., used to embed SC's in the reticle in operation 126) may be a separate device or integrated within any inspection, processing, or lithography tool.

TECHNIQUES FOR MINIMIZING PARAMETER VARIATIONS IN THE PATTERNED WAFER USING ONE OR MORE PREDICTION MODELS

Figure 2A:
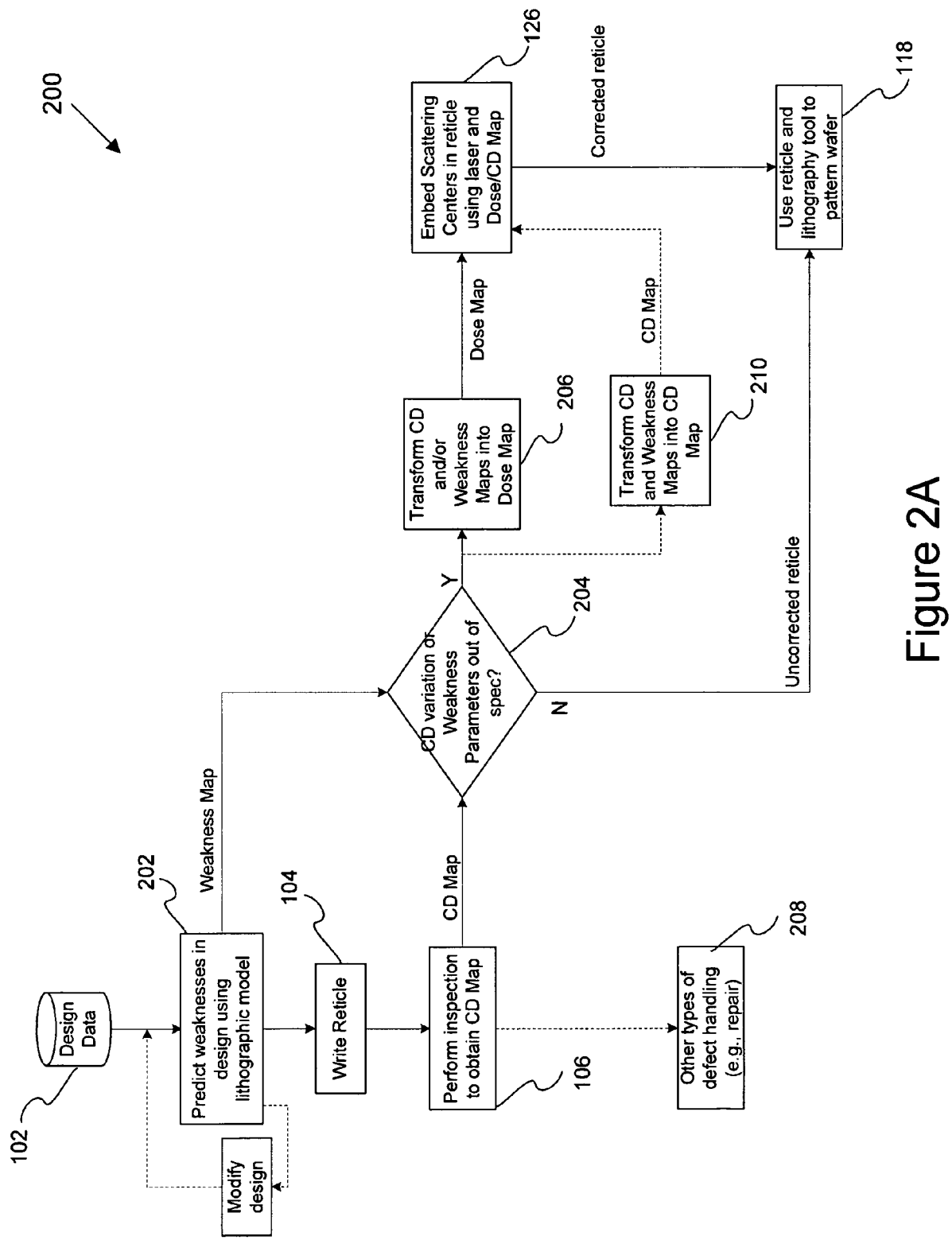
FIG. 2A is a flowchart illustrating a procedure for modifying the reticle based on design weaknesses that are predicted from the design data in accordance with one embodiment of the present invention.

One or more models for simulating processes for forming the patterned reticle and/or wafer may be advantageously used to modify a reticle to correct parameter variations in a resulting patterned wafer. The modeling techniques described herein may be utilized early in the design process prior to forming a patterned wafer or later in the design process after inspection of a patterned wafer. FIG. 2A is a flowchart illustrating a procedure 200 for modifying the reticle based on design weaknesses that are predicted from the design data in accordance with one embodiment of the present invention. Some of the operations of FIG. 2A can be implemented in a same manner as similarly labeled operations of FIG. 1. Initially, design data is received at operation 102. Design data may include the circuit layout pattern along with any corresponding modifications (e.g., optical proximity correction—OPC). At operation 202, one or more model (s) are used to predict weaknesses in the design. Generally, weaknesses include any defects or potential defects that are predicted to be present on a patterned reticle and/or patterned wafer that is fabricated with the design data under specific processing conditions. Weaknesses include any problem in a patterned wafer which may, for example, produce a non-functional IC device. Examples of predicted weaknesses include the bridging (e.g., short circuit) of adjacent line structures when no bridging is intended or the breaking (e.g., open circuit) of line structures when no breaking is intended.

Any technique or mechanism may be used to facilitate the prediction of weaknesses in the design. For instance, a reticle writing model and a lithographic model may be used to simulate a patterned wafer based on the received design data and identify areas of weaknesses in the simulated patterned wafer. The complexity of the models depends on the number and type of process parameters and patterned wafer characteristics that are correlated by the models. For example, the reticle fabrication and lithographic models can be generated based on the following process parameters: optical tool parameters (e.g., illumination settings parameters, aperture settings, aberration terms, etc.) of both the reticle writer tool and the lithography tool, reticle characteristics such as type and material composition, resist chemistry characteristics, and post-lithography processing characteristics. Various modeling techniques are described further below.

The predicted weaknesses may be identified or presented using any suitable format. For example, the model(s) can output a defect map or weakness map to identify the weaknesses at specific locations (e.g., via coordinates) in the simulated reticle or wafer pattern. Once the weaknesses are predicted in operation 202, various corrective measures may be implemented to address the weaknesses as explained further below. In some instances, the design is modified to minimize or eliminate some or all of the weaknesses. In other instances, the reticle is modified (after it is fabricated) to minimize or eliminate some or all of the weaknesses.

At operation 104, the reticle is written with a pattern based on the original design data or the modified design data. Afterwards, the patterned reticle is inspected at operation 106 and may proceed to perform other types of defect handling operations (e.g., repair) in operation 208. Any conventional reticle inspection tool or technique may be used to inspect the patterned reticle. The reticle inspection tool may also generate a mapping of measured variance values associated with the patterned reticle. For instance, a CD map may be generated.

It is then determined whether the CD variation produced by the reticle inspection and/or the weaknesses (if any) identified by the prediction model(s) are out of specification in operation 204. In most cases, identified weaknesses such as opens or shorts are inherently out of specification. Likewise, if no weaknesses are identified or predicted, then it is determined that the design weaknesses are not out of specification. Any tolerance level (e.g., ±10% from specification) may be prescribed to determine whether the CD variation or the weakness parameters are out of specification. If the CD variation or identified weaknesses are not out of specification, the uncorrected reticle is used along with lithography tools to pattern the wafer in operation 118.

If either the CD variance or identified weaknesses are determined to be out of specification, then the CD variance and/or weakness maps are transformed into a suitable format for changing the optical properties of the reticle. For instance, the CD and/or weakness maps are transformed into a dose map in operation 206. Alternatively, the CD variance and weakness maps may be transformed into a consolidated CD map in operation 210. Scattering centers are then embedded in the reticle based on the final dose or CD map using the laser (or any other suitable reticle correction tool) in operation 126. Thereafter, the corrected reticle may be used along with lithography tools to pattern the wafer in operation 118.

Weaknesses in the patterned reticle or wafer may be predicted in any suitable manner based on the design data. In general, the design data is input to one or more models that are configured to predict how the design data patterns will print onto the reticle and/or wafer. Several techniques for predicting weakness parameters using design data are further described in U.S. patent application Ser. No. 11/048, 630, entitled "COMPUTER-IMPLEMENTED METHODS FOR DETECTING DEFECTS IN RETICLE DESIGN DATA", filed Jan. 31, 2005 by Zain K. Saidin et al, which application is herein incorporated by reference in its entirety for all purposes.

Figure 2B:
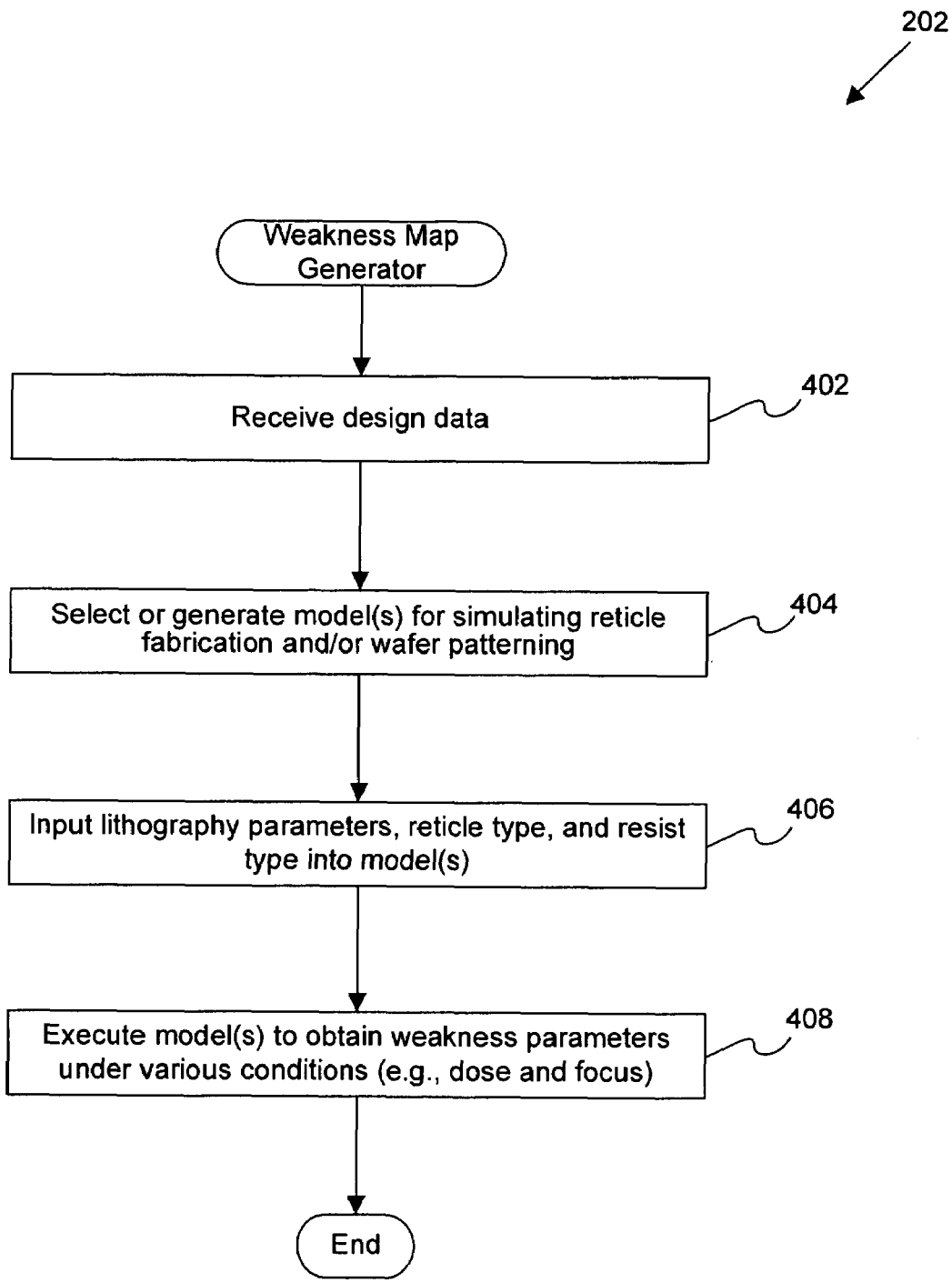
FIG. 2B is a flowchart illustrating the operation of FIG. 2A of predicting weaknesses in the design in accordance with one embodiment of the present invention.

FIG. 2B is a flowchart illustrating the operation 202 of FIG. 2A for predicting weaknesses in the design in accordance with one embodiment of the present invention. Initially, design data is received in operation 402. This design data may be generated any number of ways as described above. One or more models for simulation reticle writing and/or wafer patterning are then selected or generated in operation 404. The model may also include simulating one or more processes that are performed on the wafer after the resist is exposed. Lithography parameters, reticle characteristics, and resist chemistry characteristics are then input into the model(s) in operation 406. The model(s) are then executed to obtain weakness parameters under various conditions, such as dose and focus, in operation 408. The procedure 202 for predicting weakness parameters then ends.

In general, a model for predicting weakness parameters may be generated by printing a plurality of wafers having different noteworthy structures under various conditions. Specific features of the wafers are then inspected and analyzed to form models that correlate changes in conditions to changes in structure characteristics. In one embodiment, the presence of shorts or opens in certain structures is monitored under various conditions and model algorithms are setup to mimic the actual results. By way of examples, the conditions could include the light source wavelength of the reticle writer and lithography tool, the optical conditions of the reticle writer and lithography tool (e.g., aberration parameters and aperture settings), the specific reticle properties, and specific resist properties. The conditions could also include various post-lithography processing parameters, such as deposition composition, temperature, and rate, etching material and rate, or any suitable chemistry and physic parameters of the process.

Figure 2C:
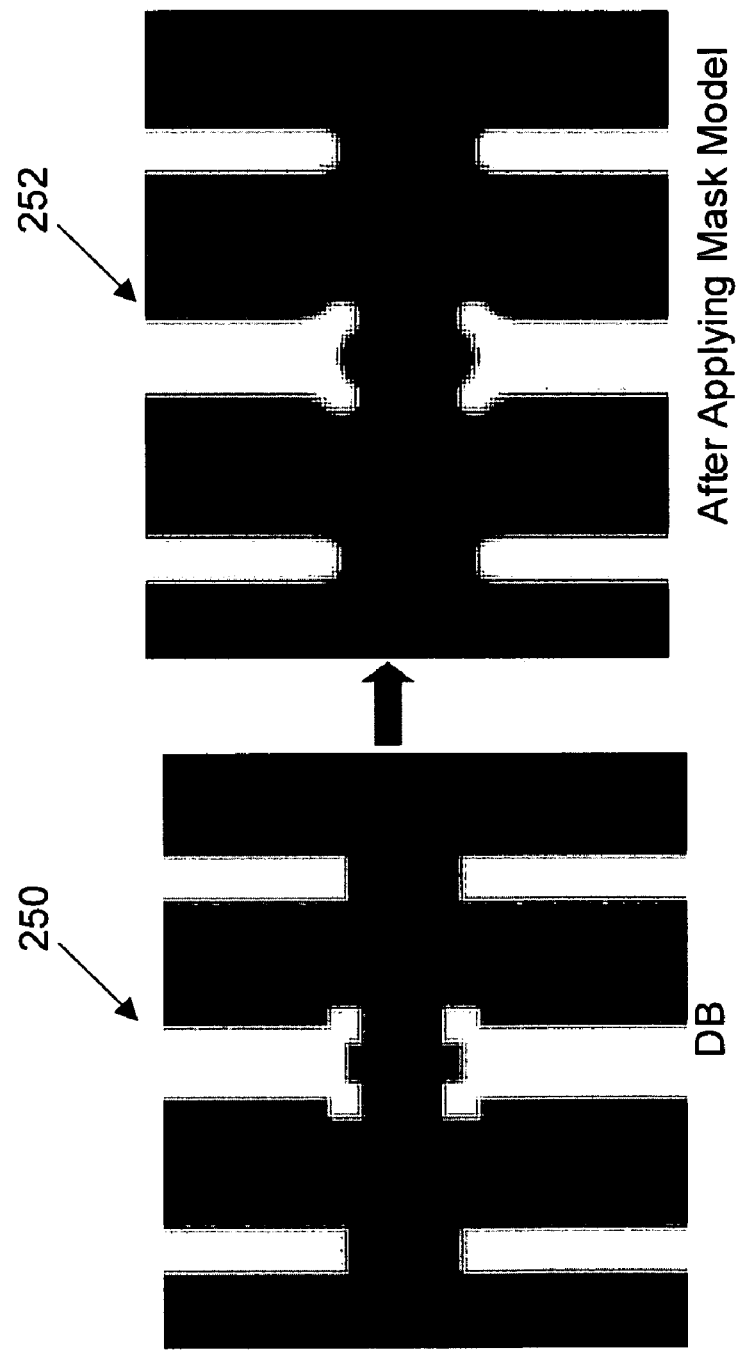
FIG. 2C illustrates a top view of design structures that are input into a mask model to produce a simulated mask image.

FIG. 2C illustrates a top view of design structures 250 that are input into a mask model to produce a simulated mask image 252. A mask model is used to predict changes that occur to the design structures when they are used to write a reticle. For example, corners of the design structures 250 are changed into mask structures 252 that have more rounded corners. A lithography tool model for simulating how the wafer patterns will be printed using the simulated mask pattern 252 may then be applied. For example, the lithography tool model may predict that the printed wafer structures will have corners (not shown) that are more rounded then the mask structures.

In one embodiment, the simulated wafer patterns or images may then be inspected utilizing any conventional inspection procedure, such as die-to-die or die-to-database, etc. For instance, a reference image of the wafer may be generated under ideal conditions or obtained from a "golden wafer" that has already passed inspection. Portions of the reference image are compared to like-portions of the simulated wafer image. Significant differences (e.g., differences above a predetermined threshold) between the reference and simulated portions are then flagged as defects. These defects may then be presented as predicted weaknesses of the design data.

Figure 2D:
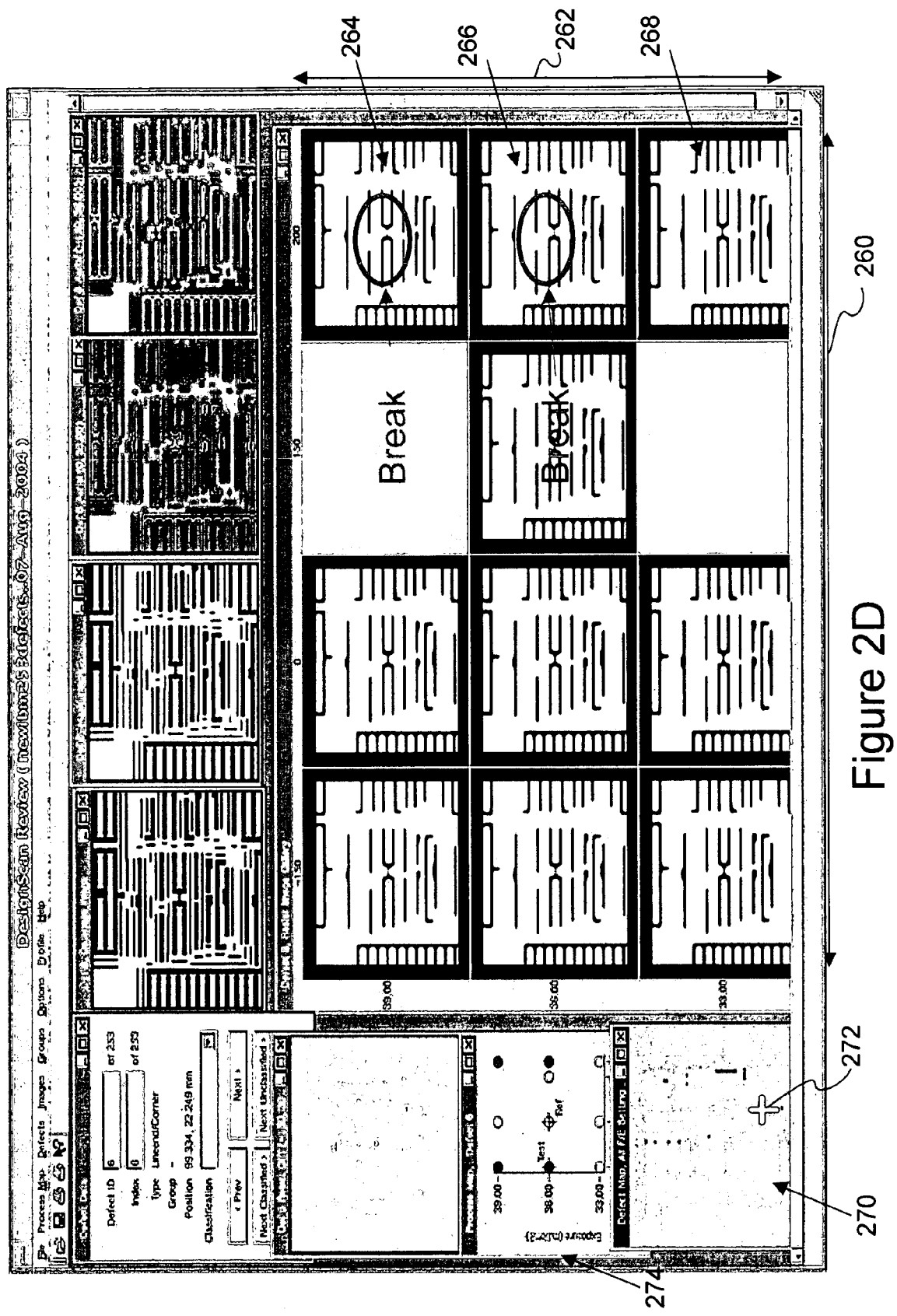
FIG. 2D is a screen shot illustrating an example of prediction output from a lithographic model in accordance with a specific implementation of the present invention.

The weaknesses produced by the model(s) may take any suitable form. FIG. 2D is a screen shot illustrating an example of prediction output from a lithographic model in accordance with a specific implementation of the present invention. As shown, a defect map 270 is presented. The defect map 270 generally highlights defects, such as shorts, partial opens, or opens, at specific locations on the simulated wafer. A user may then select a particular defect, such as defect 272, for analysis. A weakness summary map 274 may then be presented. This weakness summary map 274 may summarize the specific conditions that result in the weakness and other conditions that result in the absence of such weakness. As shown, the weakness summary map 274 shows points that are either shaded dark or light at different combinations of exposure/dose and focus. The dark points represent weaknesses or defects, while the lighter points indicate the absence of such weakness/defect at different dose and focus combinations. Weakness images may also be presented at the different dose and focus combinations. For example, the images may be arranged in a grid pattern, where each column 262 has a same focus and each row 260 has a same dose. As shown, area 272 of the simulated wafer has a short type defect in image 264 which corresponds to a focus of 200 and a dose of 39.00 and in image 266 which corresponds to a focus of 200 and a dose of 36.00.

The weakness images or weakness summary maps may be analyzed either manually or automatically to then determine an appropriate dose for each potentially weak area of the reticle so that the weakness are substantially eliminated. For instance, the weakness image 268 of FIG. 2D shows that the weakness will likely not occur if a dose of 33.00 is used for area 272 of the reticle. This methodology may be used for all the identified weaknesses to obtain a dose map that can be used to then embed scattering centers in the reticle using a laser (e.g., in operation 126) so as to reduce or eliminate the occurrence of weaknesses on the printed wafer. The variation results (e.g., CD variation) produced from a reticle inspection may also be used to then produce a dose map that is used to correct the reticle to thereby compensate for such variations. Additionally, known tool weaknesses, such as bright spots, may also be taken into account to obtain a more even light distribution through the reticle.

In the illustrated embodiment, the dose map is readily obtained from the model results since dose values that result in weaknesses and dose values that result in no weaknesses for each area of a simulated patterned wafer are available. However, if a model is used that merely presents a CD variation map, one may perform a reverse modeling algorithm to obtain a corresponding dose variation map.

Embodiments of this technique can also allow one to, in effect, achieve a wider process window for the reticle. That is, the lithography tool's dose may be selected in conjunction with reducing the effective dose through various locations or areas of the reticle by embedding SC's to thereby conform to the process windows of the various areas of the wafer. Additionally, defective wafers are less likely to be fabricated since the weaknesses were predicted and corrected early in the process. Thus, the time and expense typically required to alter the design and/or write a new reticle after a defective wafer is found is eliminated.

Figure 3A:
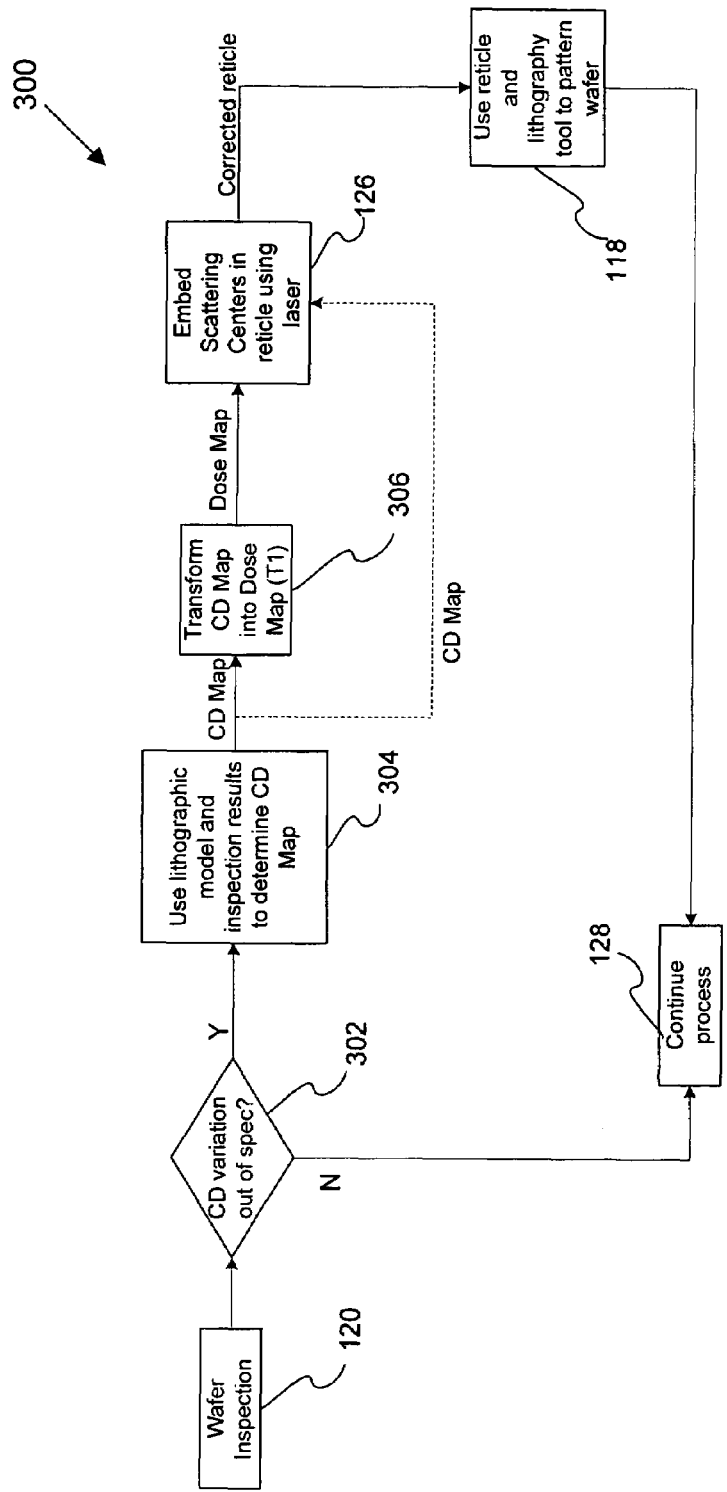
FIG. 3A is a flowchart illustrating an IC device design process in accordance with another embodiment of the present invention.

FIG. 3A is a flowchart illustrating an integrated circuit (IC) device design process 300 in accordance with another embodiment of the present invention. At operation 120, wafer inspection is conducted. As mentioned earlier, any wafer inspection tool or technique may be implemented. Next, it is determined whether the CD variation is out of specification in operation 302. Any tolerance level (e.g., ±10% from specification) may be prescribed to determine whether the CD variation is out of specification. If the determination operation of 302 is negative, then the IC design process continues in operation 128. If the determination operation of 302 is affirmative, then the inspection results are used in conjunction with a lithographic model to determine a CD map in operation 304.

The CD map may be used directly to embed scattering centers in the reticle using the laser in operation 126. However, the CD map may also be used indirectly to embed scattering centers in the reticle using the laser in operation 126. For instance, the CD map may be transformed into a dose map in operation 306 where the dose map is used directly to embed scattering centers in the reticle using the laser in operation 126. After the reticle is corrected with the embedded scattering centers, the corrected reticle may be used along with lithography tools to pattern the wafer in operation 118. Afterwards, the IC design process continues in operation 128.

A lithographic model may be used in conjunction with the inspection results to more intelligently generate a CD variation map or dose map. Several techniques for predicting weakness parameters using design data are further described in the above referenced U.S. patent application Ser. No. 11/048,630, which application is herein incorporated by reference in its entirety for all purposes. In general, lithographic models may be used to predict how different process parameters affect the CD parameter and then use this information to determine the desired CD or dose variation.

Figure 3B:
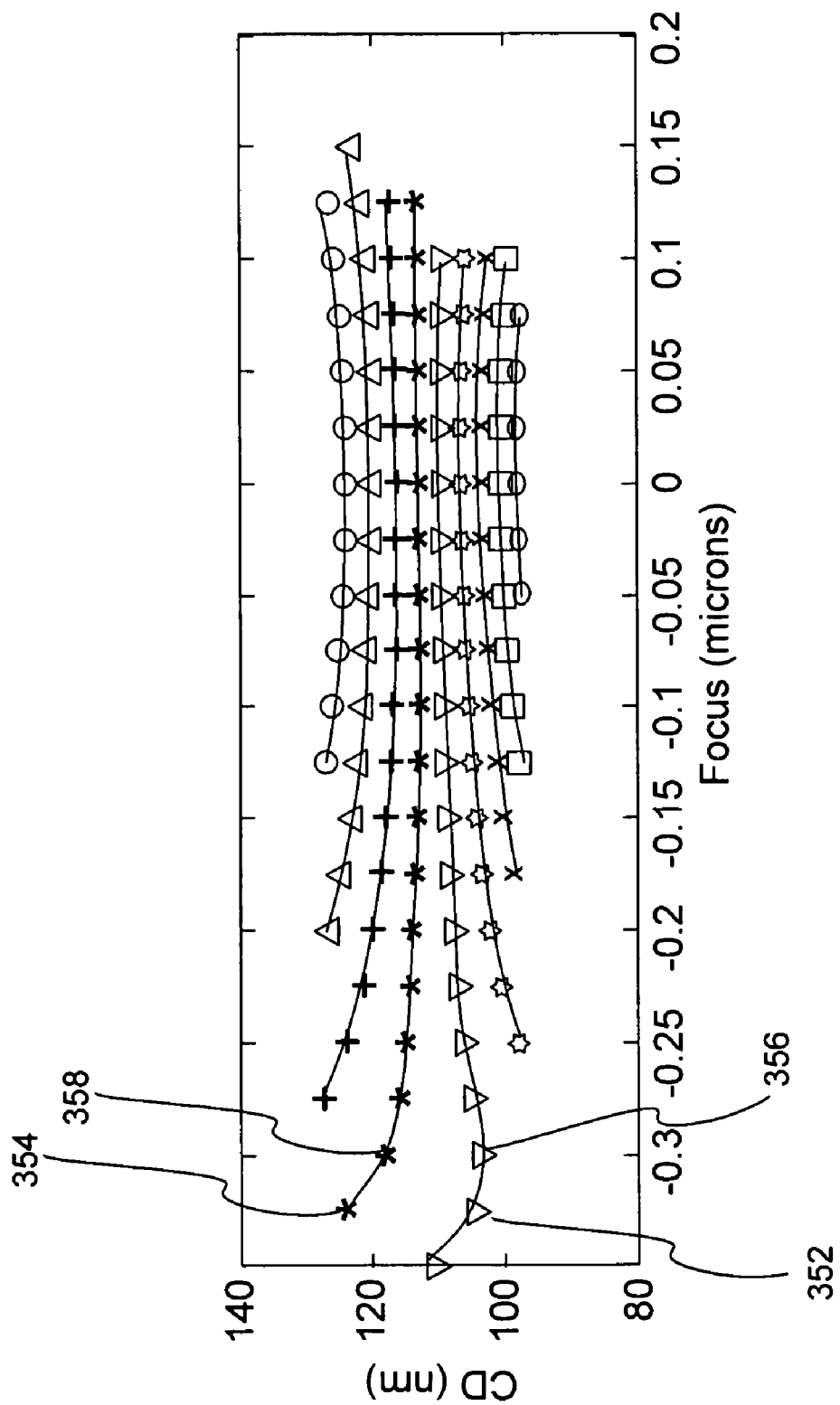
FIG. 3B is a graph illustrating CD values as a function of focus.

FIG. 3B is a graph illustrating CD values as a function of focus. This graph may also be used to illustrate the results of a model for a particular structure on a reticle. Each line of the graph has a different associated dose. If one wishes to change the CD of the structure represented in FIG. 3B, one could factor in the different relationships between focus, dose and CD as presented in FIG. 3B (as produced by a model). For example, a change in dose from point 352 to point 354 results in a larger CD than a change in dose from point 356 to point 358. That is, the dose change at a lower focus (about −0.33) results in a greater increase in CD than a dose change at a higher focus (about −0.3). In sum, conversion of a desired CD change to dose is not necessarily a linear function. A particular CD change may be translated into different dose changes depending on other operating conditions, such as focus and structure type. Such dependencies can be considered by utilizing a lithographic model in conjunction with the desired CD changes as determined from the wafer inspection results.

The modeling methods described herein can be used to detect and correct defects in reticle design data for binary mask (chrome on glass (COG) masks) or masks with any of a number of RETs such as OPC, phase-shifting masks (alternate aperture or embedded PSM (EPSM)), sub-resolution assist features (SRAFs) such as scattering bars, serifs, and hammerheads, chrome-less phase shift masks (CPL), and gray scaled images. The modeling methods can also be applied to complementary masks where the desired pattern is decomposed into multiple patterns, which are each imaged under different illumination conditions. For a complementary mask, the modeling methods include generating simulated images, each illustrating how the different, multiple patterns will be printed separately on a wafer by the different reticles. The modeling method may then use each of the simulated images in combination to generate additional simulated images (test images) that illustrate how the final reticle design pattern will be printed on a wafer using a multiple exposure wafer printing process on the scanner.

The modeling methods are equally applicable to optical lithography processes using visible, ultraviolet, and deep ultraviolet illumination (e.g., 248 nm, 193 nm, and 157 nm light sources), electron beam lithography, or extreme ultraviolet lithography using reflective masks and exposure wavelength near 13 nm. The modeling methods may also be applied to maskless lithography systems where reticle inspection is not possible. In this case, the modeling inspection has the added advantage of minimizing the need for difficult die-to-database inspection at the wafer level.

The modeling methods can be used for detecting and correcting process window marginalities in the reticle design data prior to manufacturing the masks and printing wafers. As such, the reticle design data inspection methods described herein are substantially less expensive than currently available methods. In addition, the mask making process and the wafer pattern transfer process are simulated. Therefore, the modeling methods account for how the reticle design data will be altered by the reticle manufacturing process and the wafer printing process. For the designer, modeling offers the ability to test multiple variations of a design without buying multiple variations of expensive masks. The designer may, therefore, select the reticle design implementation or correction with the broadest process window to maximize device yield in production. Modeling also provides the ability to generate reticle inspection, wafer inspection, and CD metrology and process control methods having selective sensitivity (sample plans, process window centering, and maximizing the available process window for production). Furthermore, the modeling method results may be used for optimization of the circuit design (e.g., optimization of one or more characteristics of the circuit design such as timing, parasitic, other electrical parameters, or some combination thereof).

The wafer level simulation may include simulation of the aerial image process or reticle making process, resist process, and etch process to determine the final physical pattern that would be formed on the wafer. Alternative methods include aerial image simulation only; aerial image simulation with an adjustable threshold model calibrated to emulate the real photoresist performance as a function of CD, pitch and local environment; and aerial image simulation with an adjustable threshold calibrated to emulate the pattern transfer after resist processing and etch as a function of CD, pitch, and local environment.

The simulation at the wafer level can include, therefore, not just the lithography (wafer printing) process, but the full pattern transfer process, including any, some combination, or all of the following: etch, polishing, film deposition or growth, and any other steps that affect the final structure and topography of the device. Lithography parameters for which simulated images may be generated at different values can also include degree of partial coherence, illumination mode, numerical aperture, lens aberration (e.g., Zernike coefficients), resist parameters (e.g., thickness, development rate model, lumped parameter model, Dill coefficients, and thermal diffusion coefficients) and/or film parameters (e.g., substrate reflectivity, thickness, anti-reflection coating properties, etc.).

The simulation at the wafer level can also include electrical simulation of device performance in addition to physical simulation of the patterned structures. The electrical performance of the device—either parametric properties of selected regions of the circuit (e.g., resistance, capacitance, transistor performance, etc.), performance of localized regions of the circuit (e.g., phase lock loop frequencies, timing, etc.), or the simulated performance of the full circuit as intended in the end use application—can be used as the pass/fail criteria for the design and/or to select critical regions for further inspection, metrology, and/or process control. The method may also include altering the reticle design data based on results of the modeling method. For instance, the reticle design data may be altered by altering RET feature data of the reticle design data.

The simulation of the reticle design data printed on a wafer can be performed using parameters of multiple, different reticle manufacturing processes, and the simulation of the wafer printing can be performed using parameters for multiple, different exposure tools, etch tools, or other processes. Examination of the reticle design data for different processes and tools may be valuable since each tool or process with have different aberrations that impact the pattern transfer in different ways. The modeling simulations can then be used to determine the optimum combination of design, optical enhancements (e.g., OPC, RET, etc.), mask making process, and wafer manufacturing process. The method may also include generating additional simulated images illustrating how the reticle design data will be printed on the reticle at different values of one or more parameters of the reticle manufacturing process. Further, the methods may include selecting the different values of the one or more parameters of the reticle manufacturing process that produce a minimum number of design pattern defects on the reticle.

The modeling concept and data linkages to reticle and wafer inspection, CD control, and design optimization can also be performed using printed wafers based on die-to-database inspection. Although performing such printed wafer inspection involves making a reticle and printing wafers, such modeling methods would still add value to the integrated circuit manufacturing process.

COMPUTER SYSTEM DESCRIPTION

A system configured to perform one or more of the computer-implemented methods described herein includes a computer system. The computer system may be configured to include a carrier medium. The carrier medium may be coupled to, or included in the computer system using any method or device known in the art. Program instructions implementing methods such as those described herein may be transmitted over or stored on the carrier medium. The carrier medium may be a transmission medium such as a wire, cable, or wireless transmission link, or a signal traveling along such wire, cable, or link. The carrier medium may also be a storage medium such as a read-only memory, a random access memory, a magnetic or optical disk, or a magnetic tape.

In an embodiment, the computer system may be configure to execute the program instructions to perform a computer-implemented method according to any of the above embodiments. In general, the term "computer system" may be broadly defined as any device having one or more processors, which executes instructions from a memory medium.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes ("MFC"), or other technologies or methodologies, as desired. The system may be further configured as described herein.

Although the foregoing invention has been described in some detail for purposes of clarity of understanding, it will be apparent that certain changes and modifications may be practiced within the scope of the appended claims. Therefore, the described embodiments should be taken as illustrative and not restrictive, and the invention should not be limited to the details given herein but should be defined by the following claims and their full scope of equivalents.

What is claimed is:

1. A method of mitigating variations on a patterned wafer, comprising:
   providing design data for use in fabricating a patterned reticle;
   using one or more simulation model(s) to analyze the design data so as to predict any weaknesses in the form of defects or potential defects that will be present in the patterned reticle or in a patterned wafer that is fabricated with the patterned reticle; and
   if any predicted weaknesses are out of specification, modifying the patterned reticle by using an optical beam to embed one or more scattering centers that alter one or more optical properties at one or more locations in the patterned reticle so that the predicted weaknesses are minimized on the patterned reticle or the patterned wafer.

2. The method of claim 1, further comprising:
   fabricating the patterned reticle based on the design data;
   inspecting the patterned reticle; and
   generating a variance map of measured variance values based on the inspection of the patterned reticle.

3. The method of claim 2, further comprising:
   if the variance map is out of specification, modifying the patterned reticle based on the variance map so as to minimize measured variance values resulting from the modified patterned reticle.

4. The method of claim 3, wherein modifying the patterned reticle based on the generated variance map comprises embedding scattering centers in the patterned reticle using an optical beam.

5. The method of claim 4, wherein the optical beam is produced by a femto-second second laser.

6. The method as recited in claim 1, wherein the optical beam is produced by a femto-second laser.

7. The method of claim 4, wherein the variance map is a critical dimension (CD) variance map of measured CD variance values, the method further comprising transforming the CD variance map into a dose map, wherein the operation of modifying the patterned reticle based on the variance map is accomplished by modifying the patterned reticle based on the dose map.

8. The method of claim 4, wherein the variance map is a critical dimension (CD) variance map of measured CD variance values.

9. The method of claim 1, further comprising transforming the predicted weaknesses into a dose map, wherein the operation of modifying the patterned reticle by using an optical beam to embed one or more scattering centers that alter one or more optical properties at one or more locations in the patterned reticle so that the predicted weaknesses are minimized on the patterned reticle or the patterned wafer is accomplished by modifying the patterned reticle based on the dose map.

10. A method as recited in claim 1, further comprising transforming the predicted weaknesses into a CD map, wherein the operation of modifying the patterned reticle by using an optical beam to embed one or more scattering centers that alter one or more optical properties at one or more locations in the patterned reticle so that the predicted weaknesses are minimized on the patterned reticle or the patterned wafer is accomplished by modifying the patterned reticle based on the CD map.

11. A method as recited in claim 1, wherein the one or more models include one or models for simulating reticle fabrication and/or wafer fabrication that are based on one or more of the following: one or more optical tool parameters of a reticle writer tool and/or a lithography tool, one or more reticle characteristics, one or more resist chemistry characteristics, and/or one or more post-lithography processing characteristics.

12. A method as recited in claim 11, further comprising inputting, into the one or more models, one or more of the following parameters: one or more lithography parameters, a reticle type, and/or a resist type.

13. A method as recited in claim 12, further comprising using the one or more models under a plurality of dose and/or focus lithography conditions.

14. A method as recited in claim 1, wherein the predicted weaknesses include a bridging of adjacent line structures when no bridging is intended or a breaking of line structures when no breaking is intended.

15. A method as recited in claim 1, further comprising:
    modifying the design data based on the predicted weaknesses; and
    fabricating a patterned reticle based on the modified design data.

* * * * *